United States Patent
Krajci et al.

(10) Patent No.: US 10,611,356 B2
(45) Date of Patent: Apr. 7, 2020

(54) SYSTEM AND METHOD FOR TRANSIENT WAKE UP OF PROCESSOR CONTROLLING A MOTOR OF A BRAKE BOOSTER SUBSYSTEM

(71) Applicant: Autoliv ASP, Inc., Ogden, UT (US)

(72) Inventors: Martin Krajci, Bloomingdale, IL (US); John Salamon, Ogden, UT (US)

(73) Assignee: VEONEER US, INC., Southfield, MI (US)

( * ) Notice: Subject to any disclaimer, the term of this patent is extended or adjusted under 35 U.S.C. 154(b) by 188 days.

(21) Appl. No.: 15/941,140

(22) Filed: Mar. 30, 2018

(65) Prior Publication Data

US 2019/0299960 A1    Oct. 3, 2019

(51) Int. Cl.

| | |
|---|---|
| *B60T 17/22* | (2006.01) |
| *B60T 13/74* | (2006.01) |
| *B60T 8/171* | (2006.01) |
| *B60R 16/033* | (2006.01) |
| *H03K 17/567* | (2006.01) |
| *H02P 27/06* | (2006.01) |

(52) U.S. Cl.
CPC .......... *B60T 17/221* (2013.01); *B60R 16/033* (2013.01); *B60T 8/171* (2013.01); *B60T 13/745* (2013.01); *B60T 2270/414* (2013.01); *H02P 27/06* (2013.01); *H03K 17/567* (2013.01)

(58) Field of Classification Search
CPC ...... B60T 17/221; B60T 13/745; B60T 8/171; B60T 2270/414; B60T 8/885; B60T 17/18; B60T 13/662; B60R 16/033; H03K 17/567; H02P 27/06

USPC .......................................................... 701/70
See application file for complete search history.

(56) References Cited

U.S. PATENT DOCUMENTS

| | | | | |
|---|---|---|---|---|
| 9,061,673 | B2 * | 6/2015 | Weiberle | B60T 7/042 |
| 9,199,623 | B2 * | 12/2015 | Hyun | B60T 8/885 |
| 9,409,559 | B2 | 8/2016 | Ozsoylu et al. | |
| 9,656,638 | B2 | 5/2017 | Rydsmo et al. | |
| 2017/0008497 | A1 | 1/2017 | Svensson et al. | |
| 2017/0036651 | A1 | 2/2017 | Svensson et al. | |
| 2018/0105154 | A1 * | 4/2018 | Berkemeier | B60T 13/52 |
| 2018/0118183 | A1 | 5/2018 | Spieker | |

OTHER PUBLICATIONS

Roberts, Curt M. "System and Method For Dynamic Braking of Motor Associated With Brake Booster Subsystem", U.S. Appl. No. 15/581,860, filed Apr. 28, 2018,, 25 pages.

* cited by examiner

*Primary Examiner* — Muhammad Shafi
(74) *Attorney, Agent, or Firm* — Stephen T. Olson; Harness, Dickey & Pierce, P.L.C.

(57) ABSTRACT

A system is disclosed for controlling operation of a motor-driven brake boost assist system of a vehicle braking system during a loss of battery power to the brake boost assist system. The system makes use of a brake boost assist system including a motor, an electronic control unit (ECU) for controlling operation of the brake boost assist system, and a detection system. The detection system is responsive to a transition edge of a VBATTERY signal powering the motor. The detection system is configured to generate a wakeup pulse in response to detecting the transition edge. The wakeup pulse is applied to the ECU to wake up the ECU in the event of a momentary power loss to the ECU.

18 Claims, 10 Drawing Sheets

SYSTEM AND METHOD FOR TRANSIENT WAKE UP OF PROCESSOR CONTROLLING A MOTOR OF A BRAKE BOOSTER SUBSYSTEM

FIELD

The present disclosure relates to braking systems for motor vehicles, and particularly to a braking system which can detect, in real time, when a power loss condition has arisen and a brake booster subsystem has lost power, and can dynamically wake up a processor used for controlling the brake booster subsystem, to enable the processor to take control over the motor to prevent damage to components of the brake booster subsystem.

BACKGROUND

The statements in this section merely provide background information related to the present disclosure and may not constitute prior art.

Modern day power assisted braking systems used on passenger automobiles (i.e., cars and trucks) typically make use of a brake booster to assist providing a pressurized fluid flow to the brake calipers of the vehicle when the operator depresses the brake pedal of the vehicle.

Typically the brake boost assist system includes a ball screw nut which is driven by an electric motor. In one embodiment, shown in FIG. 1, a driver applies a force on a brake pedal (not shown) which is transferred to a coupling element 1 along the direction of arrow A. A sensor within the brake boost assist system 2 (not visible in FIG. 1) detects movement of an input rod 3 caused by the pedal movement. An electronic control unit ("ECU") of the vehicle determines an appropriate control strategy. A motor (not visible) operably associated with the brake boost assist system 2 receives a signal from the ECU during a braking action, which signal is partly dependent on a sensed stroke of the brake pedal. The motor drives a belt 4 which drives a pulley 5, which in turn drives a ballscrew nut (not visible). The ballscrew nut drives a ballscrew 6 in an axial movement in accordance with arrow B. This causes movement of a piston located within a casing or housing of the brake boost assist system 2. The piston is driven in an axial motion toward a fully extended position, which changes the hydraulic pressure in a master cylinder of the vehicle. When the piston is driven axially toward its fully extended position, it provides a maximum pressurized fluid flow to the brake calipers of the vehicle to help in braking the vehicle.

In the rare event that DC power to the ECU is suddenly lost, a condition may develop in which the hydraulic pressure developed within the housing of the brake boost assist system acts on the piston and drives it rapidly and abruptly back to its fully retracted (i.e., "home") position. During this retracting movement the electric motor is driven in the opposite rotational direction by the reverse rotational movement of the ballscrew 6. Since there is little resistance provided by the motor when it is driven rotationally in the reverse direction by the ballscrew, there is a possibility that the ballscrew may be driven with significant force by its associated components (e.g., motor, pulley, etc.) such that its sudden stop may result in significant force being exerted on an interior wall of the housing. This may give rise to a risk of fracturing the housing or otherwise damaging the ballscrew. Accordingly, it would be highly desirable to somehow detect, in real time, when a power loss condition has arisen and the brake boost assist system has lost power, and to provide some mechanism for dynamically braking the motor of the brake boost assist system to prevent damage to the system.

An additional consideration is when a brake boost assist system is disconnected from DC power while the motor of the system is spinning. In this rare instance, generated voltage from the motor may damage components in the brake boost assist system. If the processor happens to be in a sleep state, for example because of a temporary power loss condition, the processor will not be able to take any action to control the motor, and thus potential damage to other components of the brake boost assist system may be incurred. Thus, some mechanism is needed to sense when the brake boost assist system has lost DC power, and to ensure that the processor controlling the brake boost assist system is activated so that the processor can take the necessary action to assert control over the motor and avoid damage to other components of the system.

SUMMARY

In one aspect the present disclosure relates to a system for controlling operation of a motor-driven brake boost assist system of a vehicle braking system during a loss of battery power to the brake boost assist system. The system may comprise a brake boost assist system including a motor, an electronic control unit (ECU) for controlling operation of the brake boost assist system, and a detection system. The detection system may be responsive to a transition edge of a VBATTERY signal powering the motor. The detection system may be configured to generate a wake up pulse in response to detecting the transition edge, the pulse being operable to provide a wake up signal to the ECU.

In another aspect the present disclosure relates a system for controlling operation of a motor-driven brake boost assist system of a vehicle braking system during a loss of battery power to the brake boost assist system. The system may comprise a brake boost assist system including a motor, an electronic control unit (ECU) for controlling operation of the brake boost assist system, and a detection system. The detection system may be responsive to both a positive transition edge and a negative transition edge of a VBATTERY signal powering the motor. The detection system may include a bipolar junction transistor for controlling generation of a wakeup pulse in response to detecting at least one of the positive and negative transition edges, the pulse being operable to provide a wakeup signal to the ECU.

In still another aspect the present disclosure relates to a method for controlling operation of a motor-driven brake boost assist system of a vehicle braking system during a loss of battery power from a vehicle battery to the brake boost assist system. In method may involve providing the brake boost assist system with a motor, the brake boost system being controlled by an electronic control unit. The method may further comprise monitoring a battery voltage signal (VBATTERY) from the battery and detecting at least one of a positive going edge transition or a negative going edge transition of VBATTERY. When the at least one positive going edge transition or negative going edge transition is detected, the method may involve generating an electrical pulse. The electrical pulse may be applied to the ECU as a wakeup signal to wake up the ECU. Thereafter, the method may involve using the ECU to control operation of the motor to avoid damage to components of the brake boost assist system.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
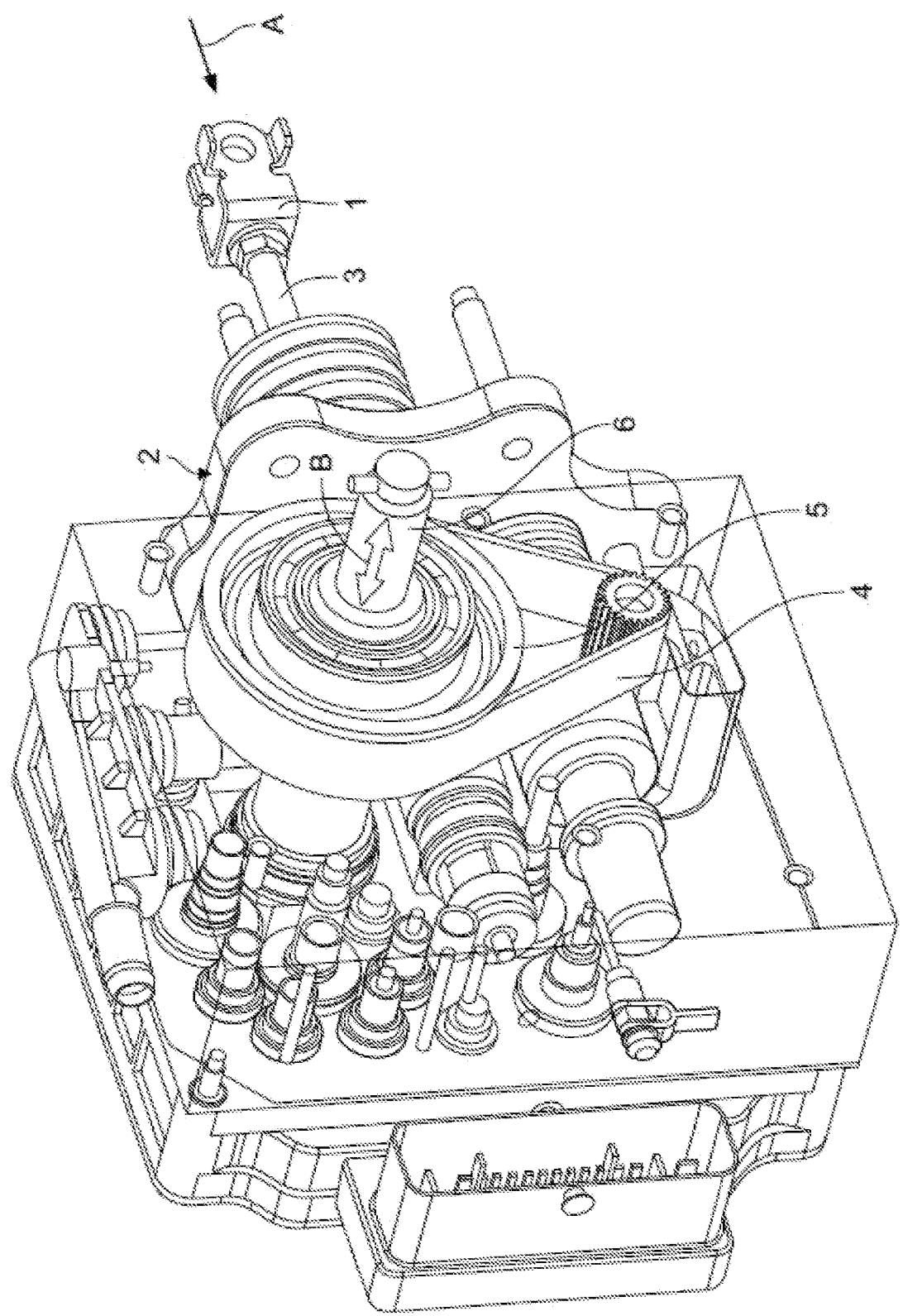
FIG. 1 is a simplified perspective drawing of a brake boost assist system which is not able to dynamically brake a motor associated with the system during operation of the system.

The following description is merely exemplary in nature and is not intended to limit the present disclosure, application, or uses. It should be understood that throughout the drawings, corresponding reference numerals indicate like or corresponding parts and features.

Figure 2A:
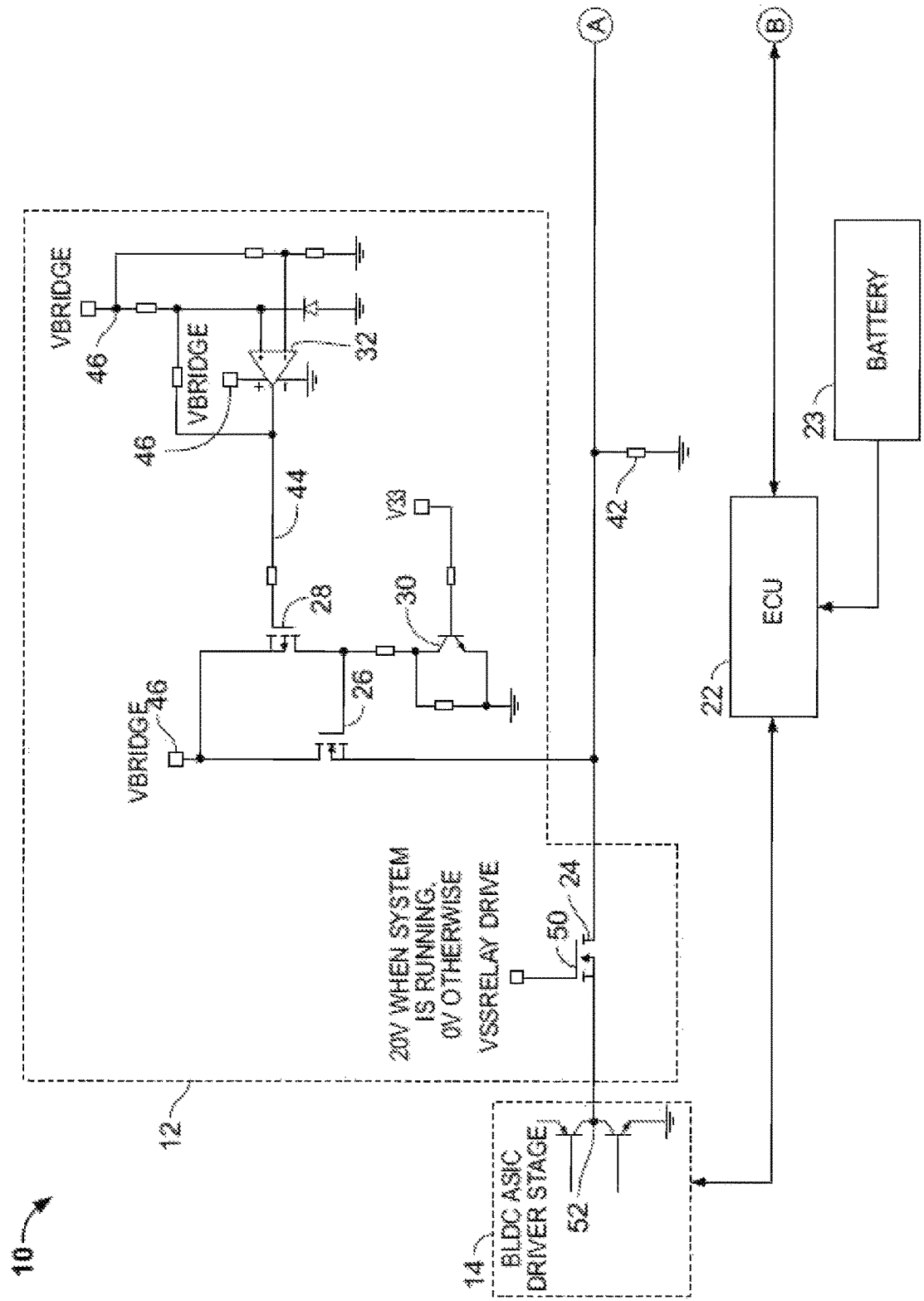
FIGS. 2A and 2B show a schematic representation of one embodiment of an electronic circuit in accordance with the present disclosure which is used to help dynamically brake the electric motor associated with the brake boost assist system shown in FIG. 1, and where the electronic circuit does not require operation of an electronic control unit (ECU) to accomplish the dynamic braking action on the motor.
Figure 2B:
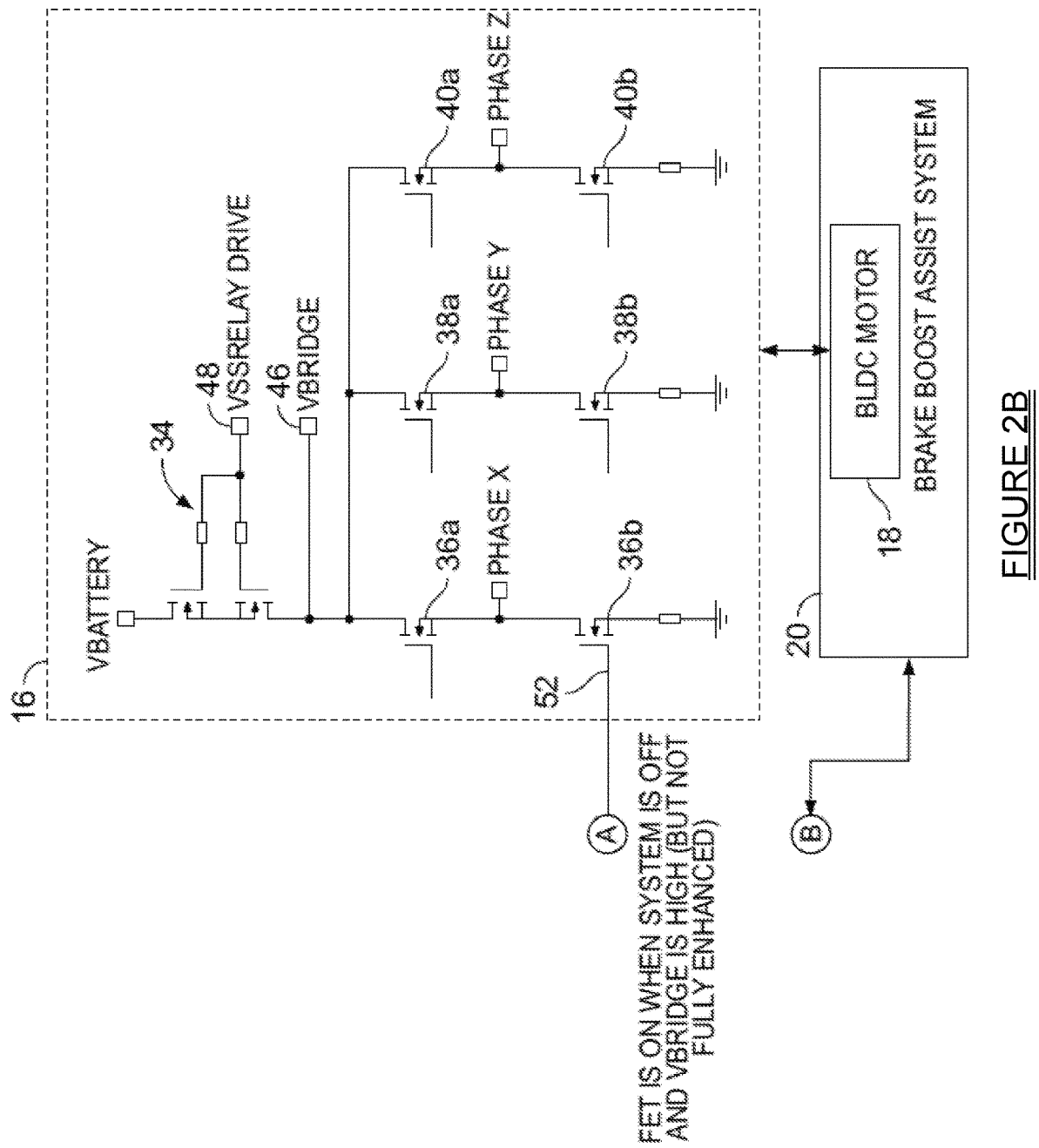

Referring to FIGS. 2A and 2B, one embodiment of a system 10 in accordance with the present disclosure is illustrated. The system 10 in this embodiment forms a circuit 12 that is interfaced between an existing brushless DC ("BLDC") motor ASIC driver stage 14 and an existing bridge switching circuit 16, which are both used to control operation of a BLDC motor 18 of a brake boost assist system 20. An important advantage of the system 10 is that it does not require any additional software to be run by an ECU 22, which is controlling operation of the BLDC motor 18, during normal operation when power is available to the ECU 22. As will be described more fully in the following paragraphs, the system 10 enables a loss of power from a battery 23 of a vehicle with which the system 10 is being used to be detected, and the bridge switching circuit 16 to be controlled, in real time, in a manner that provides a dynamic braking action on the BLDC motor 18 as it is driven rotationally by axial movement of a ballscrew of the brake boost assist system 20.

With further reference to FIGS. 2A and 2B, the circuit 12 includes a first FET 24, a second FET 26, a third FET 28, a bipolar junction transistor (BJT) 30, and a comparator circuit 32. The bridge switching circuit 16 is conventional in construction and includes a solid state relay 34, a fourth FET 36a, a fifth FET 36b, a sixth FET 38a, a seventh FET 38b, an eighth FET 40a and a ninth FET 40b. FETs 36a, 36b, 38a, 38b, 40a and 40b are switched on and off in a well-known manner to help control commutation of the BLDC motor. A resistor 42 is used to keep the FET 36b off when FET 24 is off. The BLDC ASIC has its own resistor inside of the ASIC that keeps FET 36b off when the ECU 22 is off—the resistor 42 provides the same functionality since the ASIC is isolated from the FET 36b when the ASIC is off.

The first FET 24 is used to disconnect the ASIC driver stage 14 from the bridge switching circuit 16. Second FET 26 applies a voltage to the fifth FET 36b of the bridge switching circuit 16, and BJT 30 disables the circuit 12 when the system 10 is powered on and running normally. Third FET 28 and the comparator circuit 32 operate as a voltage threshold control subsystem. It will be appreciated that FET resistance, and thus power dissipation, is only specified under certain gate to source conditions, for example usually above 5.0 volts or above 10.0 volts. To ensure that power dissipation is not excessive, it is preferable to ensure that the voltage is correct for turning the FET 28 on. The voltage control threshold provides that function, ensuring that the voltage is above 5.0 or above 10.0 volts before attempting to turn the FET 28 on. The fifth FET 36b can also be turned on by the circuit 12 to short the BLDC motor 18 phase windings as needed so that the bridge switching circuit 16 and the motor phase windings act as a load to the BLDC motor 18.

During normal operation with the battery 23 connected and supplying DC power (typically 12 vdc) to the system 10, first FET 24 will be turned on. This enables the BLDC ASIC driver stage 14 to provide a current to the bridge switching circuit 16. The bridge switching circuit 16 otherwise operates in its normal, conventional fashion to electronically commutate the BLDC motor 18. During this normal mode of operation, an output 44 of comparator circuit 32 is high, the second FET 26 is turned off, the third FET 28 is turned on, and the BJT 30 is turned on. Turning BJT 30 on effectively keeps the second FET 26 turned off.

When the system 10 loses DC power, regardless if the DC battery 23 remains physically connected to the system 10 or not, and when the BLDC motor 18 is spinning, such as it will be when the ballscrew/piston of the brake boost assist system 20 is being driven toward its home position by hydraulic pressure within the housing of the brake boost assist system 20, a voltage will still exist at point 46 (Vbridge). This is because the BLDC motor 18 will be acting as a generator and generating an AC voltage into the bridge switching circuit 16. During this power loss event, solid state relay 34 will be turned off and BJT 30 will also be turned off. The BJT 30 may be turned on by an operational voltage rail, for example an operational 3.3 voltage rail. It will be appreciated that if the 3.3V rail powering the microcontroller and other electronics on the ECU 22 is up and running—i.e. at 3.3 volts—then BJT 30 will be turned on and conducting, which will only allow the BLDC ASIC to control FET 36b. But when BJT 30 turns off, this causes second FET 26 to turn on. The loss of the VSS relay drive voltage output at point 48 from the solid state relay 34 causes a loss of voltage at gate 50 of the first FET 24. Turning off the first FET 24 disconnects an output 52 of the ASIC driver stage 14 from gate 54 of fifth FET 36b, and thus from the bridge switching circuit 16. Fifth FET 36b will be turned on and held on when Vbridge at point 46 is high.

During the above-described condition where power to the system 10 has been lost but the BLDC motor 18 is being driven rotationally by the ballscrew, the BLDC motor will be acting as a generator. When it is operating as a generator the BLDC motor 18 will be providing an AC signal back into the bridge switching circuit 16. The bridge switching circuit 16 will be acting as a full wave rectifier to provide a fully rectified DC voltage at point 46. This serves to provide DC power to the comparator circuit 32 and the second FET 26 to enable control of the bridge switching circuit 16 to be taken over during the above-described power loss event. Importantly, the bridge switching circuit 16 can be controlled to dissipate electrical power being delivered by the BLDC motor 18, and thus to dynamically brake the BLDC motor as it is being driven by the ballscrew moving toward its home position. The dynamic braking is therefore achieved with a very limited number of additional hardware components (i.e., represented by system 12), and without any action being required from the ECU 22, or any modifications to ECU software, or any modifications to the bridge switching circuit 16 itself.

Figure 3A:
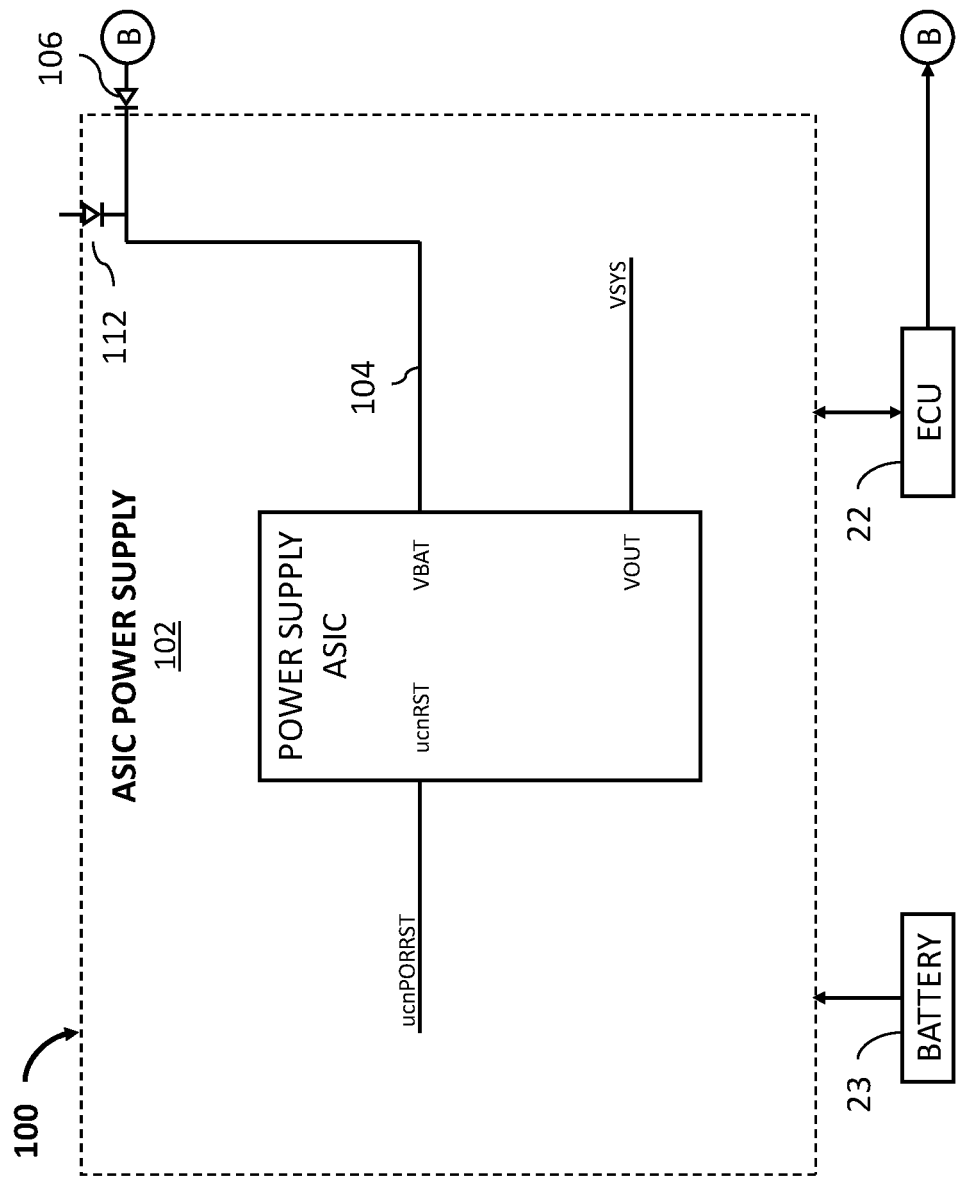
FIGS. 3A and 3B show a schematic representation of another embodiment of the present disclosure for providing dynamic braking of the motor of the boost assist system during a power loss event, but which operates to provide emergency power to the ECU obtained from a voltage generated by the motor of the brake boost assist system during the power loss event, so that the ECU can implement the dynamic braking control on the motor.
Figure 3B:
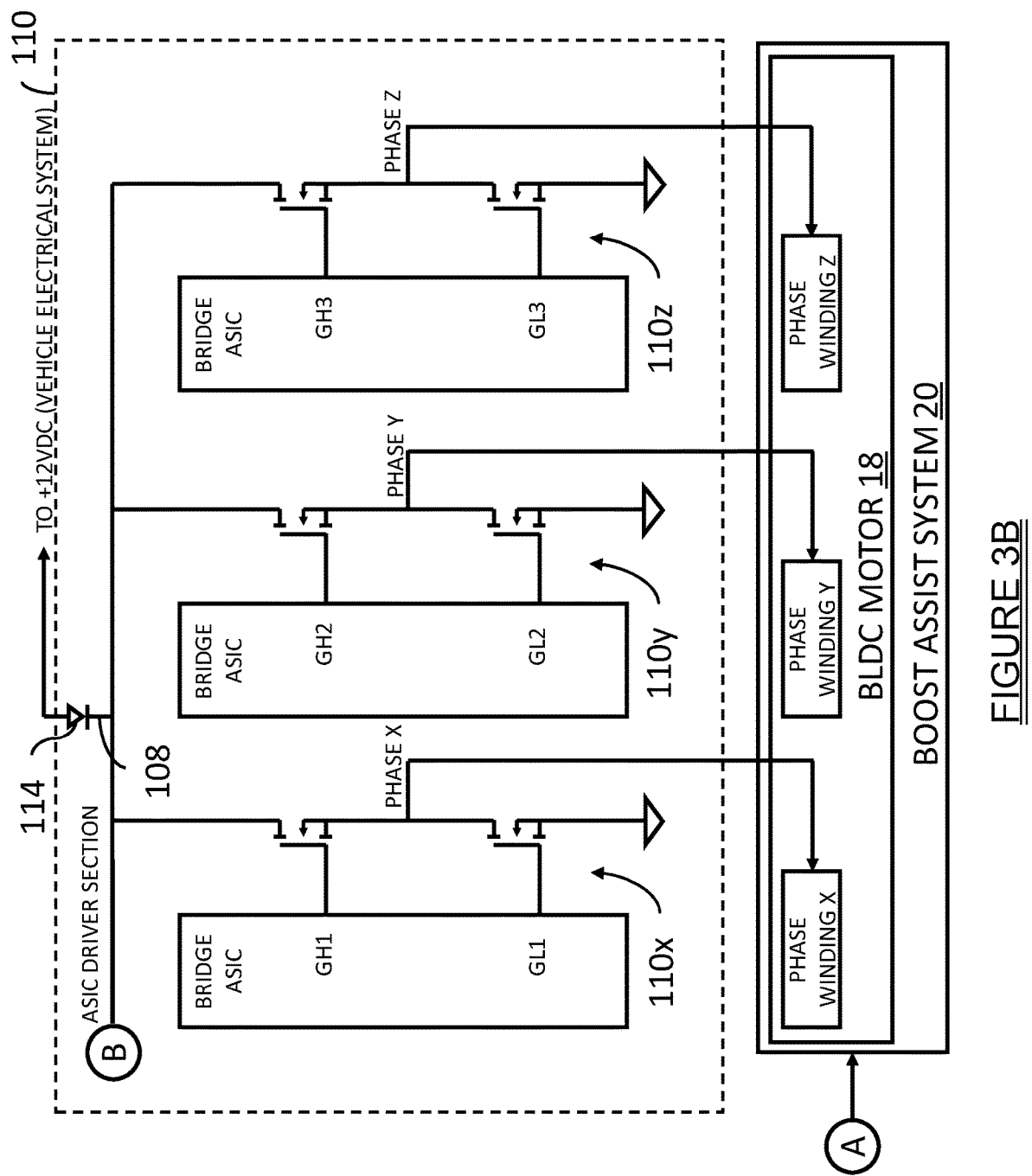

Referring to FIGS. 3A and 3B, a system 100 in accordance with another embodiment of the present disclosure is illustrated. The system 100 also operates to provide a dynamic braking action to the BLDC 18, but instead of using a network of additional electronic switches, make use of a single diode to feed a rectified DC signal provided by the bridge switching circuit 16 back into a power supply input of an ECU power supply 22a (e.g., possibly provided as a separate ASIC), which in turn powers the ECU 22. In this manner the ECU 22 can be maintained in a powered up condition even during a power loss event. This enables the ECU 22 to maintain control over the ASIC, and thus to maintain control over the bridge switching circuit 16 as needed to cause the bridge switching circuit to act as a load to dissipate the electrical power being generated by the BLDC motor 18 while it is being driven by movement of the ballscrew.

As shown in FIGS. 3A and 3B, the system 100 accomplishes powering the ECU 22 by providing a diode 106 coupled between an ASIC power supply section 102 input 104 and a common point 108 of an ASIC driver section 110. It will be appreciated that both the ECU 22 and the ASIC pre-driver section 102 may be powered by power provided by the ASIC power supply section 102. In one example implementation a single ASIC may have both the power supply section 102, which includes its own microcontroller, as well as the driver section 104. Alternatively, it is possible that these subsystems may be on separate ASICs.

The Common point 108 of the ASIC driver section 110 is tied to one side of all of the phase windings of the BLDC motor 18. The ASIC driver section 110 includes driver stages 110x, 110y and 110z which provide the drive currents to each of the X, Y and Z phase windings of the BLDC motor 18, as is well known in the art. Reverse battery protection diodes 112 and 114 connect to the vehicle's electrical system and prevent the generated DC voltage produced at common point 108, when the BLDC motor 18 is acting as a generator, from being coupled to other portions of the vehicle electrical system. The diode 114 may also be a solid state relay. If the diode 114 is implemented as a solid state device, then it provides the ability to disconnect the ASIC driver section 110 from the vehicle's battery as well.

When the ballscrew of the boost assist system 20 begins being driven toward its home position by hydraulic pressure after power is initially lost, the BLDC motor 18 begins operating as a generator and produces an AC voltage that is fed into the ASIC bridge driver section 110. The bridge driver section 110 then produces a DC voltage at common point 108. This is because the FETs within the ASIC driver section 110, which are not being turned on at this point because of the loss of power to the ASIC pre-driver section 102, have parasitic body diodes which enable the FETs of the driver section 110 to act as a full wave bridge rectifier circuit. The DC voltage at point 108 can then be used to forward bias diode 106 and apply the generated DC voltage signal to the ASIC power supply section 102. This allows the ASIC power supply section 102 to power back up and to generate the DC output signal needed to power back up the ECU 22. Again, when the power loss condition initially occurs, the ECU 22 will immediately power down, but the time delay between when the DC signal at point 108 is produced and the ASIC power supply section 102 is powered back up, and then powers back up the ECU 22, is very short. Typically this time delay may be as little as about 1 ms-10 ms. So in practical terms, the ECU 22 will be powered back up virtually immediately after losing power, and can then command the ASIC power supply section 102 to begin controlling the driver section 110 as needed to dynamically brake the BLDC motor 18.

Figure 4:
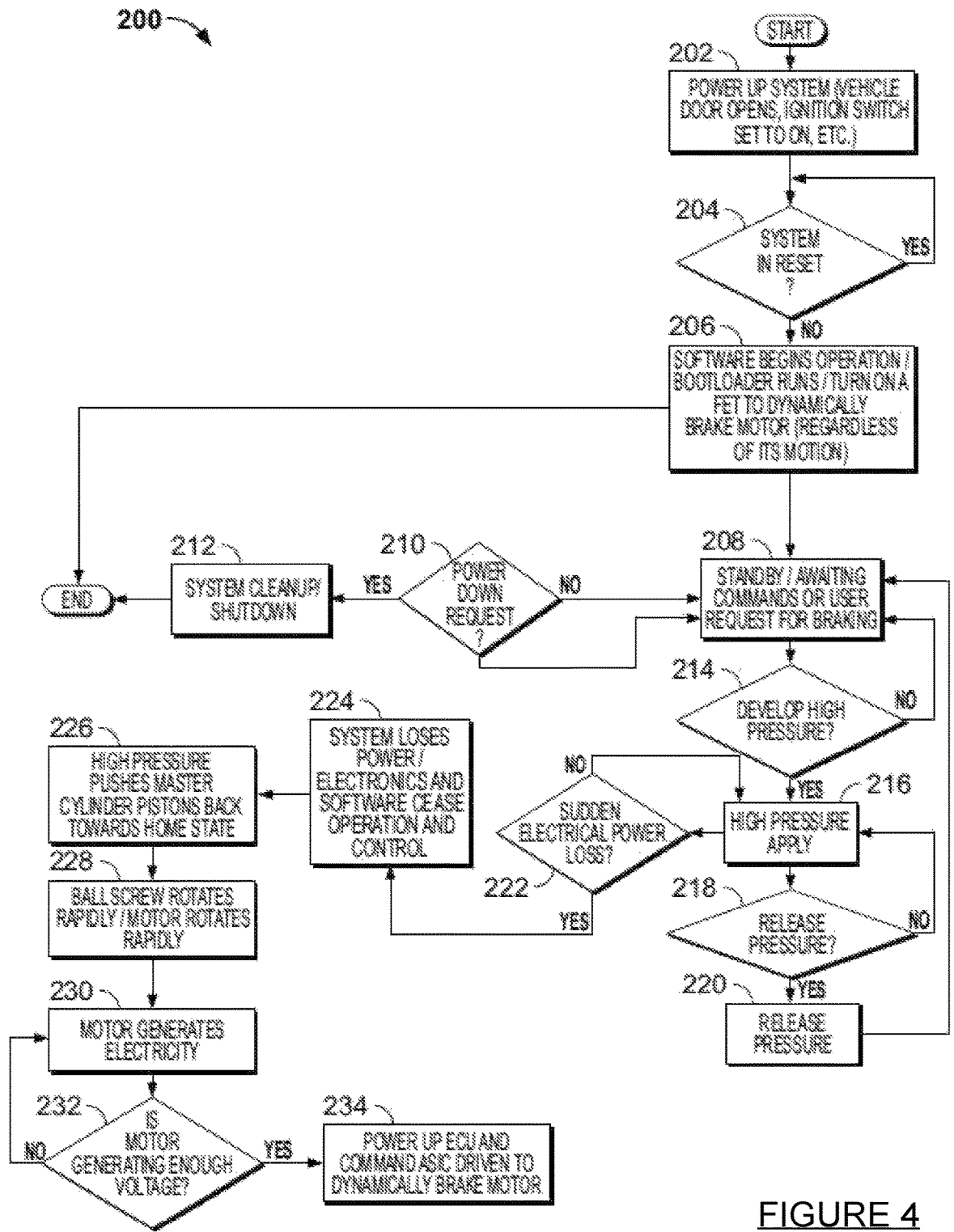
FIG. 4 is a flowchart of a series of operations performed by the electronic circuit of FIGS. 3A and 3B in monitoring for and detecting a power loss event, and powering back up the ECU during the power loss event.

With reference to FIG. 4, a flowchart for a software control module 200 is shown to illustrate how the software control module may use the components of system 100 to detect a power loss event and to control the ASIC driver section 110 to dynamically brake the BLDC motor 18. Initially at operation 202, the system 100 is powered up when some predetermined event occurs, for example a vehicle door is opened or an ignition switch of the vehicle is turned on. The system 100 will always execute a reset operation when powering up. A check is made at operation 204 to determine if the reset operation is complete. By "complete" it is meant that the power supply rails are in the correct voltage range, and have been stable for a predetermined amount of time (i.e., typically a few milliseconds). System 100 is in the midst of performing a reset operation. If the check at operation 204 is not complete, then the check at operation 204 is re-executed until the reset operation is complete. When the reset operation is detected as being complete, then at operation 206 a bootloader operation is started which causes the ASIC drive section 110 to be controlled to dynamically brake the BLDC motor 18 regardless of the direction of rotation of the motor.

At operation 208 the software module 200 enters a standby mode and waits for commands or a user request for braking by sensing a position of the vehicle's brake pedal. At operation 210 a check is made if a power down request has been received and, if not, operation 208 is repeated. If a power request is detected as having been received at operation 210, then the software module 200 performs a shutdown routine at operation 212. If the a command for high braking pressure is detected at operation 214, then at operation 216 the boost assist system 20 is used to generate a high pressure response to initiate a braking action at the vehicle's brake calipers. At operation 218 a check is made to detect if a "release pressure" signal has been received by the brake boost assist system 20 and, if so, the pressure is released by the boost assist system as indicated at operation 220.

At operation 222 a check is made if the system 100 has experienced a power loss event while the high pressure response is being performed. If not, the high pressure response is continued at operation 216. But if a power loss event has been detected at operation 222, then the system 100 will lose power to the ASIC power supply section 102, which will cause a power loss at the ECU 22 as well. These conditions are indicated at block 224. In this event, the high pressure developed within the vehicle's master cylinder will cause the master cylinder pistons to be driven back towards the home position. The ballscrew and its attached piston within the boost assist system 20 will also be pushed back towards its home position, causing the BLDC motor 18 to begin rotating rapidly in the retracting direction of rotation, as indicated by block 228. The BLDC motor 18 will then begin generating an AC signal, as indicated at block 230, which is virtually immediately converted to a full wave rectified DC voltage by the ASIC driver section 110. A check is then made at operation 232 to determine if the BLDC motor 18 is generating at least a predetermined minimum voltage (at common point 108 in the ASIC driver section 110) which is sufficient to run the ECU 22. If not, operation 230 is repeated. But if a sufficient voltage is being generated, then at operation 234 the ECU 22 is powered back up and the ECU controls the ASIC driver section, via the ASIC power supply section 102, to dynamically brake the motor.

In one implementation of the software control module 200 described above, when the ECU 22 is powered back up at operation 234, the ECU boots up through its normal boot up routine. This normal boot up routine may therefore involve a fairly extensive sequence of checks and resets for a wide variety of electronic subsystems of the vehicle. In a modified implementation of the software control module 200, operation 234 instead involves performing a "quick boot" sequence. The quick boot sequence involves an abbreviated set of checks and resets to significantly shorten the boot up sequence and allows the ECU 22 to more quickly gain control over the ASIC bridge driver section 110. The quick boot sequence may also make use of various algorithms for controlling various vehicle subsystems in a limited operational condition to further save power. The quick boot sequence may even involve eliminating DC power to certain non-essential subsystems (e.g., sensors, solenoids, communications networks) of the ASIC while the power loss event is occurring.

The hardware based system 10 may likewise optionally include software programmed into the ECU 22 used therewith to shed certain loads if a power loss event is detected, and the system 10 detects that it is running on power being generated by the BLDC Motor 18. In this manner non-essential ECU subsystems may remain powered down to ensure that sufficient power is available to control the additional electronic switches of the system 10 during the power loss event.

Figure 5:
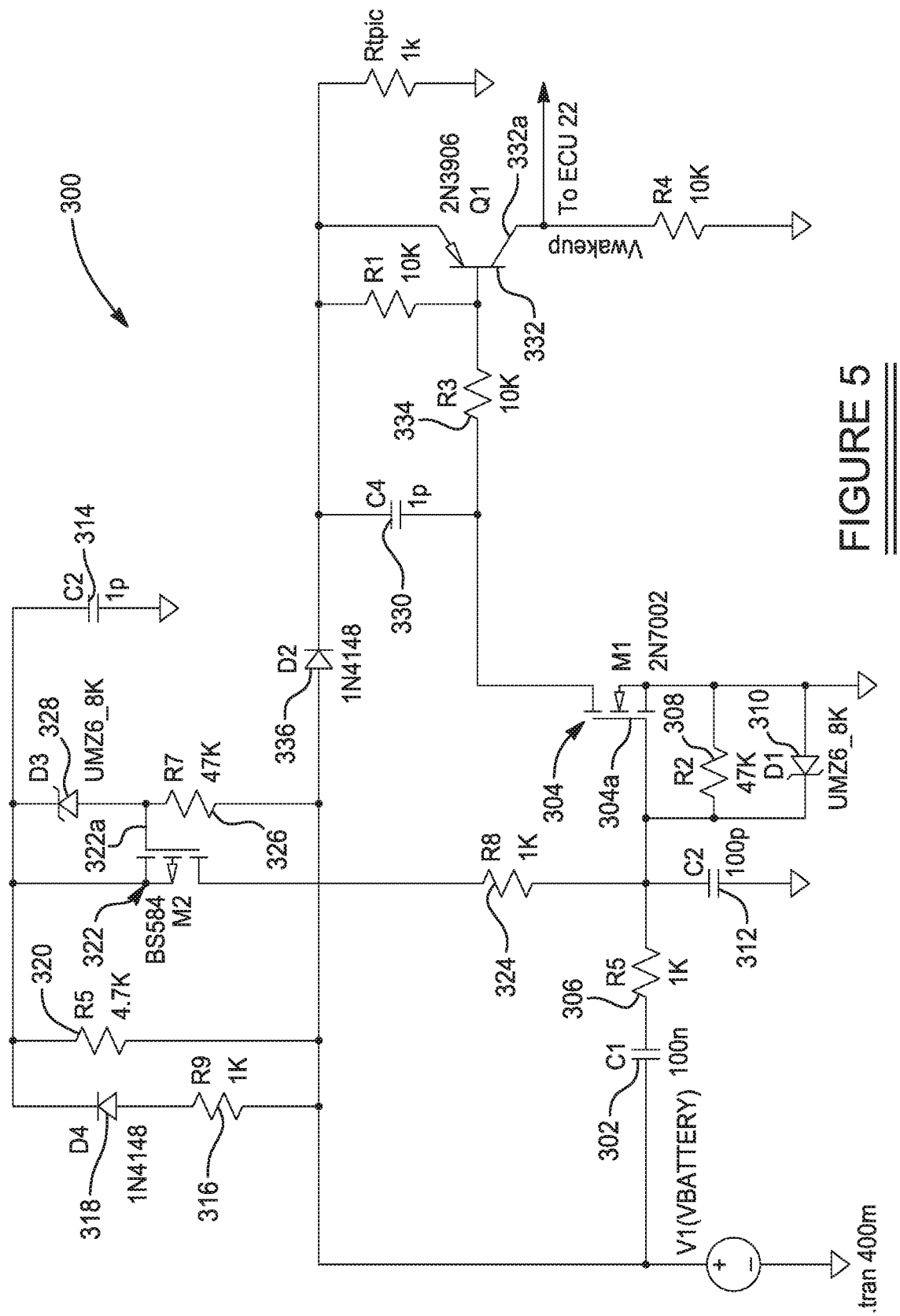
FIG. 5 is a circuit diagram illustrating a detection system in accordance with another embodiment of the present disclosure for waking up a microcontroller responsible for controlling the motor of the boost assist system in the event of a loss of power to the boost assist system while the ECU is in a sleep state.

Referring to FIG. 5, a detection system 300 is shown which may be used with system 100, or by itself, to help control operation of the brake boost assist system 20. The system 300 addresses the situation where the brake boost assist system 20 (FIG. 2B) is disconnected from DC power while the BLDC motor 18 is spinning. If this occurs, then generated voltage produced by the BLDC motor 18 may potentially damage components in the brake boost assist system 20. As explained above, the ECU 22 would normally be used to control the driver section 110 so that the driver section dampens the BLDC motor 18 operation in the event the motor is spinning when power is lost. However, if the power disconnect to the BLDC motor 18 is accompanied by a temporary power loss to the ECU 22, the ECU may be in a sleep state and unable to take action. The system 300 monitors the motor supply voltage V1 (i.e., VBATTERY) and takes advantage of the fact that an unregulated voltage generated by the BLDC motor 18 will result in a change in motor voltage from the regulated state or the unpowered state. The system 300 is able to detect a transition edge of VBATTERY and generates a short electrical pulse which can be used to "wakeup" the ECU 22, so that the ECU can use appropriate software (such as represented by software module 200) to control the driver section 110 and dampen the motor.

A principal advantage of the system 300 is that it adds no resistive path to VBATTERY to ground, and in a regular state (i.e., normal operating state with no edge on VBATTERY), all active components of the system 300 are off. Therefore, the system 300 has no noticeable impact on a key-off current being drawn from the vehicle's battery when the vehicle is not in use.

Referring to FIG. 5, if a positive-going edge appears on V1 (VBATTERY), it will propagate on capacitor 302 and onto the gate 304a of MOSFET 304, and will turn on the MOSFET 304. The capacitor 302 will then discharge through resistor 306 and resistor 308 to ground. Accordingly, capacitor 302, resistor 306 and resistor 308 may control the duration of which the MOSFET 304 remains conducting (i.e., stays turned on). The edge of VBATTERY must be greater than Vgs(threshold) of the MOSFET 304. Therefore, the MOSFET 304 should preferably be selected which has a low Vgs (threshold).

Zener diode 310 protects the gate of MOSFET 304 from excessive voltage during battery connect or from even larger battery transients originating from VBATTERY. The Zener diode 310 also prevents the gate of MOSFET 304 from going more than 0.7V below ground during a negative voltage transient. This has the advantage that a positive voltage transient will turn on the MOSFET 304 even if it is followed by a negative voltage transient.

An important consideration for the system 300 is that the positive-going edge time constant is faster than the time constant provided by capacitor 302 and resistors 306 and 308. If it desired that a slower positive-going edge be detected, the time constant may need to be adjusted through the selection of appropriate values for the capacitor 302 and the resistors 306 and 308.

The system 300 further includes a capacitor 312 that, in combination with resistor 306, forms a low pass filter that prevents fast transients from damaging the gate of MOSFET 304. Depending on the gate capacitance of capacitor 302, capacitor 312 may not be needed, in which case it may be omitted from the system 300.

If negative edge detection for VBATTERY is desired, then capacitor 314 may be included. Capacitor 314 follows the VBATTERY peaks, as it charges quickly through resistor 316 and diode 318. Capacitor 314 discharges more slowly via resistor 320 when VBATTERY is decreasing. In a steady state, the voltage at capacitor 314 is VBATTERY.

If a negative-going edge appears on VBATTERY that is faster than the rate of discharge of capacitor 314 via resistor 320, a MOSFET 322 will turn on. Charge from capacitor 314 will then flow via MOSFET 322 into capacitor 302 and capacitor 312. This will increase the gate voltage of MOSFET 304 and turn on MOSFET 304. It is important for this control scheme that capacitor 314 be much larger in capacitance than the combined capacitances of capacitors 302 and 312. Resistor 324 limits the current flow into the Zener diode 310 so that the Zener voltage of the Zener diode 310 does not exceed the Vgs rating of the MOSFET 304. Similarly, a resistor 326 tied to the gate 322a of the MOSFET 322 limits current flow into Zener diode 328 to protect the MOSFET 322. Edge rate detectability can be adjusted by changing the selection of resistor 320 and capacitor 314.

When the system 300 operates as a "wakeup" pulse generator for the ECU 22, the MOSFET 304 turns on momentarily, based on parameters selected by RC constants around MOSFET 304 and MOSFET 322 (if the negative-going edge detection components described above are included). This quickly discharges a capacitor 330, tied to the drain 330a of MOSFET 304, to ground and turns on the MOSFET 304. The wakeup signal will be available on the collector 332a of bipolar junction transistor 332. The transistor 332 will remain turned on as long as capacitor 330 is charging to VBATTERY-Vbase-emitter (of transistor 332) via resistor 334. The wakeup pulse duration can be adjusted by changing the RC time constant provided through the selection of values for the resistor 334 and the capacitor 330. The wakeup pulse duration will always be influenced by the VBATTERY voltage.

It will also be appreciated that in this example, VBATTERY to diode 336 to resistor 338 (Rtpic) path is the existing path of TPIC power.

Optionally, another NPN transistor (not shown) can be placed on the collector leg 332a of the transistor 332, with its collector pulled up to VCC. This can serve as a feedback to the ECU 22 that an edge was detected.

Figure 6:
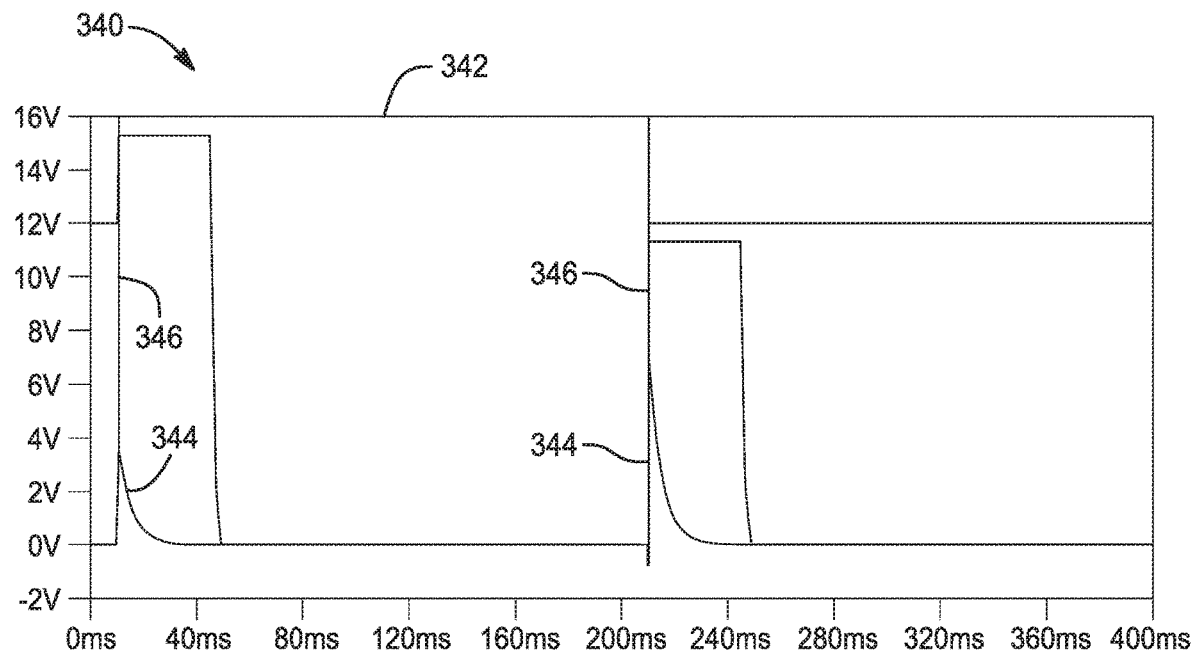
FIG. 6 shows a plurality of waveforms including a simulation of the VBATTERY signal, a signal representing the gate of a MOSFET of the detection system, and a wakeup pulse signal generated by the detection system.

Referring to FIG. 6, a simulation 340 shows the VBATTERY signal 342, a signal 344 representing the gate of MOSFET 304, and a wakeup pulse signal 346. In this example the edges have 1 ms rise and fall times between 12V and 16V (4V edge). The wakeup pulse signal 346 duration is set to approximately 50 ms in this example, and it can be seen that it is slightly lower than VBATTERY due to a diode 336 (FIG. 5) and the V collector-emitter of transistor 332.

Figure 7:
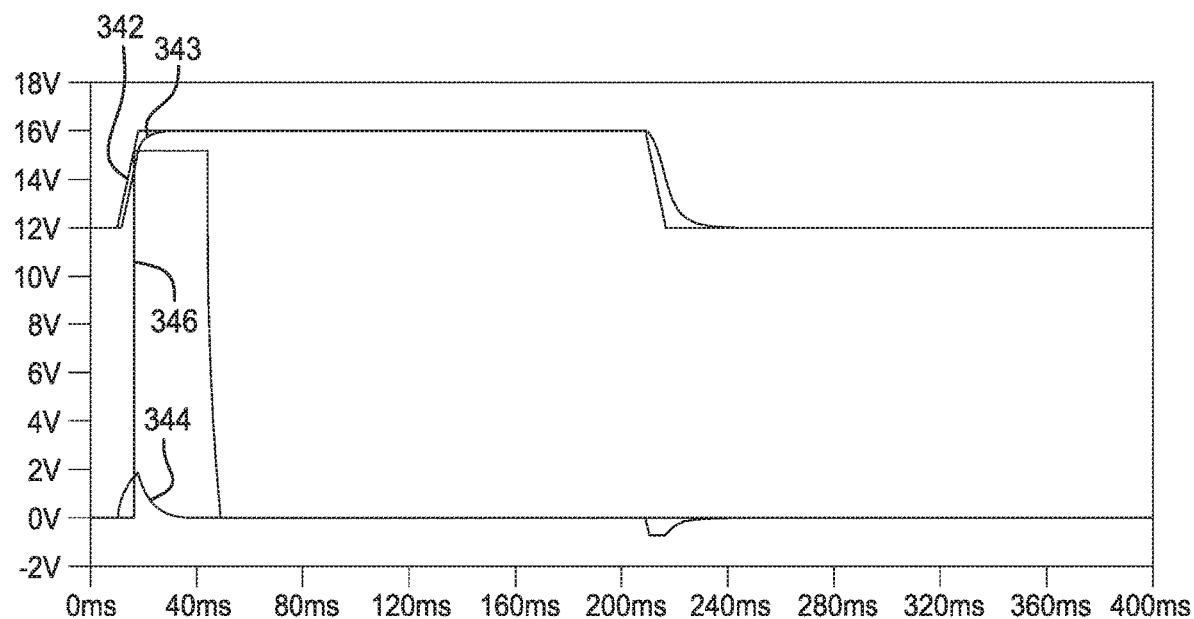
FIG. 7 illustrates the rise time and fall time of the VBATTERY signal being only 8 ms, along with the wakeup signal pulse and the gate signal that is generated when detecting the transition of the VBATTERY signal.
Figure 8:
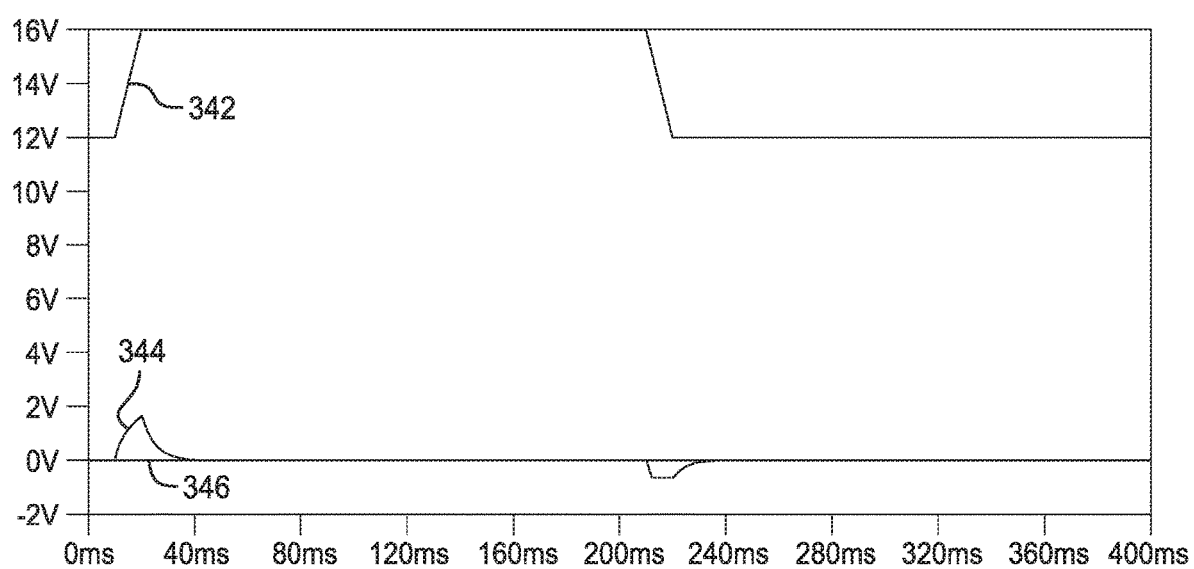
FIG. 8 illustrates the edges of the VBATTERY signal being 10 ms, which is too slow to raise the gate voltages on the MOSFETs to create the wakeup signal pulse.

FIG. 7 illustrates the rise time and fall time of VBATTERY signal 342 and the gate pulse signal 344 being only 8 ms. Only the rising (i.e., positive-going) edge of the VBATTERY signal 342 was detected and not the falling edge. The wakeup pulse signal 346 is therefore generated only in response to the positive-going edge of the VBATTERY signal 342. The trace 343 along the top of FIG. 6 illustrates that the source voltage of 322 closely tracks the VBATTERY/gate voltage. The difference is insufficient to turn on the MOSFET 322. FIG. 8 shows the positive-going and negative-going edges of the signal VBATTERY 342 now being 10 ms. This is too slow to raise the gate voltages on the MOSFETs 304 and 322.

Figure 9:
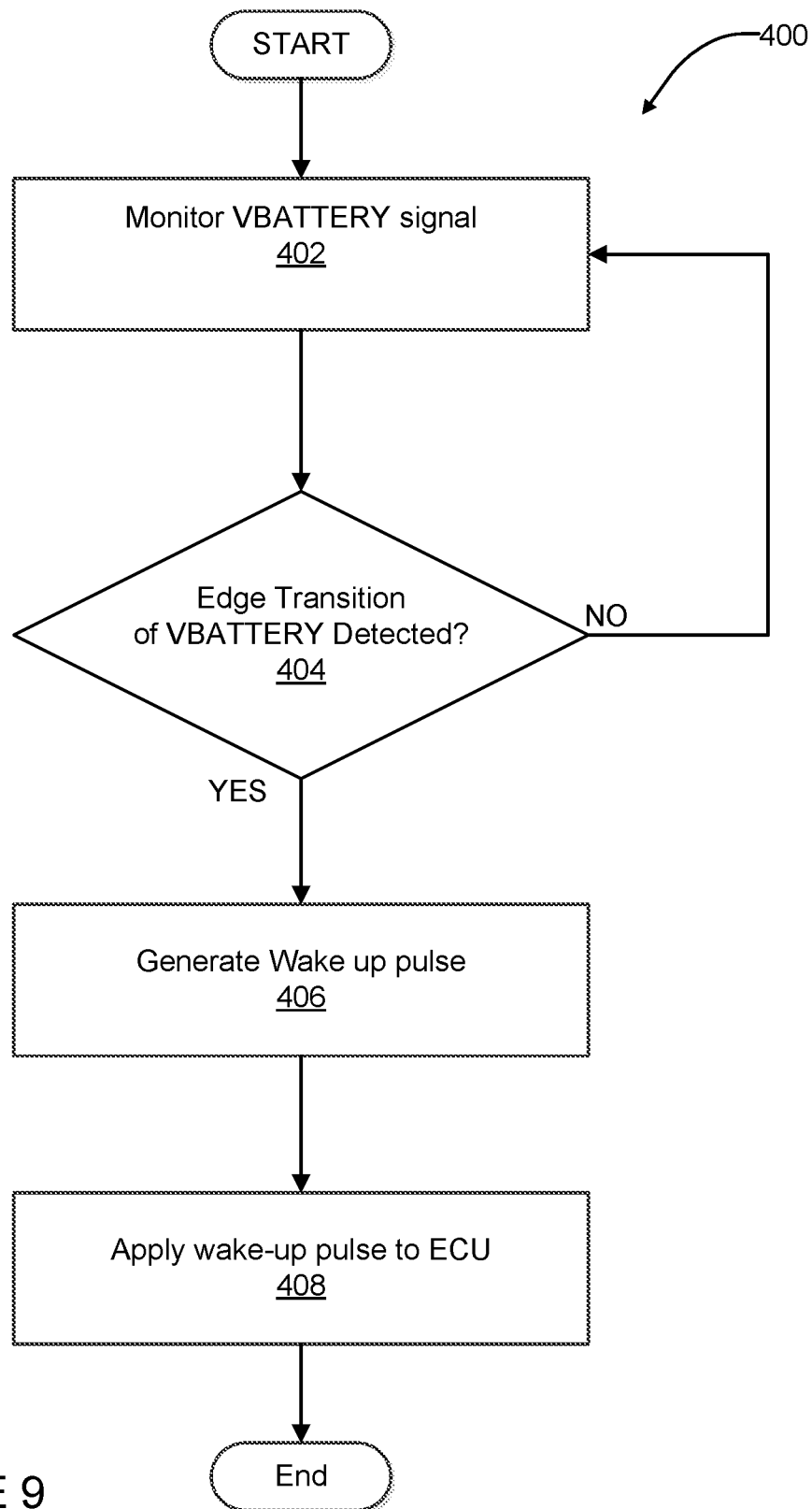
FIG. 9 is a high level flowchart illustrating operations performed by the detection system.

Referring to FIG. 9, a flowchart 400 is shown summarizing various operations that may be performed by the detection system 300. Initially, at operation 402 the system 300 monitors the VBATTERY signal 342 and looks for an edge transition. As noted above, the duration of the edge transition (either positive-going or both positive going and negative-going) will be set by the selection of values for various components of the system, and in this example it will be assumed that the system 300 needs to "see" a positive-going edge transition for the VBATTERY signal 342 which is no more than about 8 ms in duration.

At operation 404 a check is made by the system 300 if an edge transition has been detected. If not, operation 402 is repeated. If an edge transition is detected at operation 404, the system 300 generates the wakeup pulse signal 342 at operation 406. The wake up pulse signal 342 is then applied to the ECU 22 at operation 408 to wake up the ECU.

The examples illustrate the various embodiments and are not intended to limit the present disclosure. Therefore, the description and claims should be interpreted liberally with only such limitation as is necessary in view of the pertinent prior art.

What is claimed is:

1. A system for controlling operation of a motor-driven brake boost assist system of a vehicle braking system during a loss of battery power to the brake boost assist system, the system comprising:
   a brake boost assist system including a motor;
   an electronic control unit (ECU) for controlling operation of the brake boost assist system; and
   a detection system responsive to a transition edge of a VBATTERY signal powering the motor, the detection system configured to generate a wake up pulse in response to detecting the transition edge, the pulse being operable to provide a wake up signal to the ECU.

2. The system of claim 1, wherein the detection system includes:
   a first capacitor coupled to VBATTERY;
   at least one first resistor coupled to the capacitor;
   a first field effect transistor (FET) having a gate coupled to the at least one first resistor; and
   the first capacitor and the first resistor helping to form a first RC time constant for controlling how quickly the first FET turns on.

3. The system of claim 2, wherein the detection system further includes a second capacitor, the second capacitor operating in connection with the at least one first resistor to form a low pass filter to protect the gate of the first FET.

4. The system of claim 2, wherein the detection system further comprises third capacitor coupled to a drain of the first FET for helping to control generation of the pulse.

5. The system of claim 4, wherein the detection system further comprises a bipolar junction transistor and a second resistor coupled to a base of the bipolar junction transistor, the pulse being presented on a collector of the bipolar junction transistor when the first FET is turned on.

6. The system of claim 5, wherein the detection system further comprises a third resistor coupled to the third capacitor, and wherein a capacitance of the third capacitor and a resistance of the third resistor form an RC time constant for determining a duration of the wakeup pulse.

7. The system of claim 2, further comprising a fourth capacitor arranged to be charged by the VBATTERY signal, the fourth capacitor also being coupled to a fourth resistor and a second FET to detect a negative edge transition of the VBATTERY signal.

8. The system of claim 7, wherein the second FET comprises a second metal oxide semiconductor field effect transistor.

9. The system of claim 2, wherein the first FET comprises a first metal oxide semiconductor field effect transistor.

10. A system for controlling operation of a motor-driven brake boost assist system of a vehicle braking system during a loss of battery power to the brake boost assist system, the system comprising:
    a brake boost assist system including a motor;
    an electronic control unit (ECU) for controlling operation of the brake boost assist system; and a detection system responsive to both a positive transition edge and a negative transition edge of a VBATTERY signal powering the motor, the detection system including a bipolar junction transistor for controlling generation of a wakeup pulse in response to detecting at least one of the positive and negative transition edges, the pulse being operable to provide a wakeup signal to the ECU.

11. The system of claim 10, wherein the detection system includes a
   a first capacitor coupled to the VBATTERY signal;
   at least one first resistor coupled to the capacitor;
   a first field effect transistor (FET) having a gate coupled to the at least one first resistor; and
   the first capacitor and the first resistor helping to form a first RC time constant for controlling how quickly the first FET turns on.

12. The system of claim 11, wherein the at least one first resistor comprises two resistors, with one being coupled to the first capacitor and the other being coupled across a gate of the first FET and to ground.

13. The system of claim 11, wherein the detection system further comprises a second capacitor, the second capacitor operating in connection with the at least one first resistor to form a low pass filter to protect the gate of the first FET.

14. The system of claim 13 wherein the detection system further comprises a third capacitor coupled to a drain of the first FET for helping to control generation of the pulse.

15. The system of claim 14, wherein the detection system further comprises a third resistor coupled to the third capacitor, and wherein a capacitance of the third capacitor and a resistance of the third resistor form an RC time constant for determining a duration of the wake up pulse.

16. The system of claim 15, further comprising a Zener diode coupled to an additional resistor and to a gate of the second MOSFET, and to the third capacitor, the additional resistor and the Zener diode protecting the gate of the second MOSFET against transient voltages that exceed a predetermined voltage that would damage the second MOSFET.

17. The system of claim 11, further comprising a Zener diode coupled across the gate of the first FET and the source of the first FET, for protecting the gate of the first FET against transient voltages that exceed 0.7V.

18. A method for controlling operation of a motor-driven brake boost assist system of a vehicle braking system during a loss of battery power from a vehicle battery to the brake boost assist system, wherein the brake boost assist system includes a motor, the brake boost system being controlled by an electronic control unit, the method comprising:
   monitoring a battery voltage signal (VBATTERY) from the battery;
   detecting at least one of a positive going edge transition or a negative going edge transition of VBATTERY;
   when the at least one positive going edge transition or negative going edge transition is detected, generating an electrical pulse;
   applying the electrical pulse to the ECU as a wakeup signal to wake up the ECU; and
   thereafter using the ECU to control operation of the motor to avoid damage to components of the brake boost assist system.

* * * * *